US010001525B2

(12) United States Patent
Kang et al.

(10) Patent No.: US 10,001,525 B2
(45) Date of Patent: Jun. 19, 2018

(54) SEMICONDUCTOR DEVICE AND METHOD FOR TESTING THE SAME

(71) Applicant: Industry-Academic Cooperation Foundation, Yonsei University, Seoul (KR)

(72) Inventors: Sungho Kang, Seoul (KR); Jaeseok Park, Seoul (KR)

(73) Assignee: Industry-Academic Cooperation Foundation, Yonsei University, Seoul (KR)

( * ) Notice: Subject to any disclaimer, the term of this patent is extended or adjusted under 35 U.S.C. 154(b) by 206 days.

(21) Appl. No.: 14/785,042

(22) PCT Filed: Feb. 25, 2014

(86) PCT No.: PCT/KR2014/001507
§ 371 (c)(1),
(2) Date: Oct. 16, 2015

(87) PCT Pub. No.: WO2015/125990
PCT Pub. Date: Aug. 27, 2015

(65) Prior Publication Data
US 2016/0097810 A1    Apr. 7, 2016

(30) Foreign Application Priority Data

Feb. 19, 2014 (KR) .......................... 10-2014-0019152

(51) Int. Cl.
*G01R 31/26* (2014.01)
*G01R 31/3177* (2006.01)
(Continued)

(52) U.S. Cl.
CPC ......... *G01R 31/3177* (2013.01); *G01R 31/26* (2013.01); *G01R 31/2853* (2013.01);
(Continued)

(58) Field of Classification Search
CPC .................. G01R 31/3177; G01R 31/2853
See application file for complete search history.

(56) References Cited

U.S. PATENT DOCUMENTS 9,157,960 B2 * 10/2015 Bringivijayaraghavan H01L 22/22
2011/0040902 A1 * 2/2011 Housty ............... G06F 11/3037
710/15
(Continued)

FOREIGN PATENT DOCUMENTS

JP    2007-158237 A    6/2007
JP    2011-081887 A    4/2011
(Continued)

OTHER PUBLICATIONS

International Preliminary Report and Written Opinion for PCT/KR2014/001507 dated Sep. 1, 2016.
(Continued)

*Primary Examiner* — Jermele M Hollington
*Assistant Examiner* — Feba Pothen
(74) *Attorney, Agent, or Firm* — Harness, Dickey & Pierce, P.L.C.

(57) ABSTRACT

A semiconductor device and a method for testing the same are provided. The semiconductor device includes a plurality of semiconductor dies staked, a plurality of through-electrodes disposed between the semiconductor dies, a first calculation unit calculating a first output value from input signals inputted into the through-electrodes by a logical operation, a second calculation unit calculating a second output value from output signals outputted from the through-electrodes by a logical operation, and a comparator comparing the first output value with the second output value.

15 Claims, 8 Drawing Sheets

(51) Int. Cl.
  *G11C 29/40* (2006.01)
  *G01R 31/28* (2006.01)
  *G01R 31/317* (2006.01)
  *G01R 31/3185* (2006.01)
  *G11C 29/02* (2006.01)

(52) U.S. Cl.
  CPC .......... *G01R 31/31703* (2013.01); *G01R 31/318513* (2013.01); *G11C 29/40* (2013.01); *G11C 29/025* (2013.01)

(56) References Cited

U.S. PATENT DOCUMENTS

| | | | | |
|---|---|---|---|---|
| 2012/0025846 | A1* | 2/2012 | Minas | G01R 31/2853 324/606 |
| 2012/0324305 | A1* | 12/2012 | Whetsel | G01B 31/318538 714/733 |
| 2014/0374923 | A1* | 12/2014 | Park | H01L 25/0657 257/777 |

FOREIGN PATENT DOCUMENTS

| | | | |
|---|---|---|---|
| KR | 10-1038996 | B1 | 6/2011 |
| KR | 10-1143443 | B1 | 5/2012 |
| KR | 2012-0045366 | A | 5/2012 |
| KR | 2012-0058156 | A | 6/2012 |
| KR | 10-1180408 | B1 | 9/2012 |
| KR | 2013-0004045 | A | 1/2013 |
| KR | 2013-0047056 | A | 5/2013 |
| WO | WO-2013-037048 | A1 | 3/2013 |

OTHER PUBLICATIONS

The publication by inventor(s) : Jaeseok Park and Sungho Kang, "A New TSV Set Architecture for High Reliability", 5th Asia Symposium on Quality Electronic Design, 20 pages, Aug. 27, 2013.
U. Kang,"8 Gb 3-D DDR3 DRAM using through-silicon-via technology", Trans. on Journal of Solid-State Circuits, 45(1): 9 pages, Jan. 2010.
A. Hsieh, and T. Hwang, "TSV redundancy: architecture and design issues in 3-D IC", Trans. on Very Large Scale Integration Systems, vol. 20, No. 4, 1 pages, Apr. 2012.
International Search Report PCT/ISA/210 for International Application No. PCT/KR2014/001507 dated Nov. 18, 2014.
Written Opinion of the International Searching Authority PCT/ISA/237 for International Application No. PCT/KR2014/001507 dated Nov. 18, 2014.

* cited by examiner

SEMICONDUCTOR DEVICE AND METHOD FOR TESTING THE SAME

TECHNICAL FIELD

Embodiments of the inventive concepts relate to a semiconductor device, and more specifically, to a three-dimensional semiconductor device including semiconductor dies stacked and a method for testing the same.

BACKGROUND ART

In a situation in which the development of semiconductor processes almost closes to limits, a three-dimensional semiconductor device has been spotlighted in recent year. A three-dimensional semiconductor device like a three-dimensionally stacked memory is implemented in high integration, high performance and low power. The three-dimensional semiconductor may be implemented in a structure having a plurality of layers, that is, a structure in which a plurality of semiconductor dies are staked, and signals are transferred through a through-silicon via (TSV) made vertically between semiconductor dies stacked. The three-dimensional semiconductor is integrated with elements (or devices) of which the number is more than a two-dimensional semiconductor, thereby lowering yields and causing breakdown phenomenon. Thus, a technology for ensuring reliability of the three-dimensional semiconductor is required. To cope with the event that a part of through-electrodes (e.g., TSVs) fail, redundancy through-electrodes (redundancy TSV) replacing a defective through-electrode as well as normal through-electrodes (normal TSVs) are formed in a semiconductor manufacturing level. When the TSV fails, the defective through-electrode (TSV) is replaced with the extra TSV, that is, the redundancy through-electrode, thereby making it possible to transfer a signal between the semiconductor dies using the redundancy through-electrode. This means that yields of the three-dimensional semiconductor increase through this repair technique. To take high yields, it is necessary to form a sufficiently large number of redundancy through-electrodes. In this case, when repairing of the defective through-electrodes is completed, redundancy through-electrodes which are not replaced are wasted as a simple metal line without any use.

DISCLOSURE

Technical Problem

Embodiments of the inventive concepts provide a semiconductor device and a method for testing the same, capable of testing a semiconductor device using redundancy through-electrodes (e.g., RTSV), which are not used after repairing defective through-electrodes, and improving reliability of a three-dimensional semiconductor.

Embodiments of the inventive concepts provide a semiconductor device and a method for testing the same, capable of performing an on-line test in real time and detecting a soft error.

Technical Solution

According to an embodiment of the inventive concept, a semiconductor device is provided which includes a plurality of semiconductor dies staked, a plurality of through-electrodes disposed between the semiconductor dies, a first calculation unit calculating a first output value from input signals inputted into the through-electrodes by a logical operation, a second calculation unit calculating a second output value from output signals outputted from the through-electrodes by a logical operation, and a comparator comparing the first output value with the second output value. According to an embodiment of the inventive concept, the first calculation unit and the second calculation unit calculate the first output value and the second output value through the same logical combination operation, respectively.

According to an embodiment of the inventive concept, each of the first calculation unit and the second calculation may include XOR gates coupled in a multiple-stage tree structure.

According to an embodiment of the inventive concept, the plurality of through-electrodes comprise at least one redundancy through-electrode, and the first output value is transmitted through a first redundancy through-electrode among the at least one redundancy through-electrode.

According to an embodiment of the inventive concept, the semiconductor device may further include a first signal channel determination unit selecting the first redundancy through-electrode of the at least one redundancy through-electrode and outputting the first output value to the first redundancy through-electrode.

According to an embodiment of the inventive concept, the first signal channel determination unit selects the first redundancy through-electrode of redundancy through-electrodes which remain after replacing defective through-electrodes.

According to an embodiment of the inventive concept, the semiconductor device may further include a second signal channel determination unit selecting the first redundancy through-electrode of the at least one redundancy through-electrode and outputting the first output value received through the first redundancy through-electrode to the comparator. According to an embodiment of the inventive concept, the second signal channel determination unit outputs a selection signal by determining whether there exists a redundancy through-electrode remaining after replacing a defective through-electrode, and the semiconductor device may further include a multiplexer selecting an output of the comparator or a logical low signal based on the selection signal.

According to an embodiment of the inventive concept, the comparator may include an XOR gate comparing the first output value, received from the second signal channel determination unit, and the second output value, received from the second calculation unit.

According to an embodiment of the inventive concept, a method of testing a semiconductor device may include calculating a first output value from input signals, inputted to the through-electrodes, through a logical operation by the first calculation unit, calculating a second output value from output signals, outputted from the through-electrodes, through a logical operation by the second calculation unit, comparing the first output value with the second output value by the comparator, and determining whether the through-electrodes are normal, based on an output of the comparator.

According to an embodiment of the inventive concept, on-line testing is performed to determine whether the through-electrodes are normal, while transmitting signals between the semiconductor dies through the through-electrodes.

According to an embodiment of the inventive concept, a three-dimensional semiconductor device is provided which includes a plurality of semiconductor dies stacked, and a plurality of signal transmission units transmitting signals between the semiconductor dies. Each of the signal transmission units may include a plurality of through-electrodes disposed between the semiconductor dies, the plurality of through-electrodes comprising a plurality of redundancy through-electrodes, a first calculation unit calculating a first output value from input signals, inputted to the through-electrodes, through a logical operation, a second calculation unit calculating a second output value from output signals, outputted from the through-electrodes, through the same logical operation as the first calculation unit, and a comparator comparing the first output value transmitted through first redundancy through-electrode among the plurality of redundancy through-electrodes with the second output value transmitted from the second calculation unit to output a comparison value. According to an embodiment of the inventive concept, the three-dimensional semiconductor device may further include a first signal channel determination unit selecting the first redundancy through-electrode of the at least one redundancy through-electrode and outputting the first output value to the first redundancy through-electrode, and a second signal channel determination unit selecting the first redundancy through-electrode of the at least one redundancy through-electrode and outputting the first output value received through the first redundancy through-electrode to the comparator.

According to an embodiment of the inventive concept, the three-dimensional semiconductor device may further include an OR gate receiving comparison values from the signal transmission units and outputting a result of an OR operation to a controller, and a register storing the comparison values. According to an embodiment of the inventive concept, a semiconductor device is provided which includes a plurality of semiconductor dies stacked, a plurality of through-electrodes disposed between the semiconductor dies, a plurality of first calculation units each calculating a first output value from at least a portion of input signals inputted to the through-electrodes through a logical operation, a plurality of second calculation units each calculating a second output value from at least a portion of output signals outputted from the through-electrodes through the same logical operation as the first calculation units corresponding thereto, and a plurality of comparators outputting comparison values by comparing the first output values of the first calculation units with the second output values of the second calculation units corresponding to the first calculation units, to output comparison values.

According to an embodiment of the inventive concept, the plurality of through-electrodes comprise a plurality of redundancy through-electrodes, and the first calculation units calculate the first output values from different signals of the input signals, respectively, and the second calculation units calculate the second output values from different signals of the output signals, respectively.

According to an embodiment of the inventive concept, the first output values of the first calculation units are transmitted through different redundancy through-electrodes.

According to an embodiment of the inventive concept, the semiconductor device may further include a first signal channel determination unit selecting a first redundancy through-electrode, which transmit the first output values of the first calculation units, from among the redundancy through-electrodes and outputting the first output values to the selected first redundancy through-electrodes, and a second signal channel determination unit selecting the first redundancy through-electrodes of the redundancy through-electrodes and outputting the first output values received through the first redundancy through-electrode to the comparators. According to an embodiment of the inventive concept, the second signal channel determination unit outputs a selection signal according to the number of redundancy through-electrodes remaining after replacing a defective through-electrode, and the semiconductor device may further include a multiplexer selecting an output of each of the comparators or a logically low signal based on the selection signal.

According to an embodiment of the inventive concept, the semiconductor device may further include an OR gate receiving the comparison values from the comparators and outputting a result of an OR operation on the comparison values to a controller, and a register storing the comparison values.

Advantageous Effects

According to embodiments of the inventive concept, a semiconductor device may be tested using through-electrodes remaining after repairing a defective through-electrode(s).

According to embodiments of the inventive concept, on-line testing may be performed in real time and a soft error may be detected.

BEST MODE

Other advantages and features of the inventive concepts and methods of accomplishing the same may be understood more readily with reference to the following detailed description of an embodiment and the accompanying drawings. However, the scope and spirit of the inventive concept may not be limited thereto. The present invention may be only defined by appended claims. Even though it is not defined, all terms (including technical or scientific terms) used herein have the same meanings as those belonging to the invention is generally accepted by common techniques in the art. General description of the known configurations may be omitted so as not to obscure the subject matter of the present invention. Preferably the same reference to the same or corresponding reference numerals in the figures of the present invention is used.

A semiconductor device according to an embodiment of the inventive concept may include a plurality of semiconductor dies staked, a plurality of through-electrodes disposed between the semiconductor dies, a first calculation unit calculating a first output value from input signals inputted into the through-electrodes through a logical operation, a second calculation unit calculating a second output value from output signals outputted from the through-electrodes through a logical operation, and a comparator comparing the first output value with the second output value. According to embodiments of the inventive concept, the semiconductor device may be tested using through-electrodes which remain (or are not used for repairing) after repairing defective through-electrodes (e.g., through-silicon via (TSV)). In addition, according to embodiments of the inventive concept, on-line testing may be performed in real time and a soft error may be detected.

Figure 1:
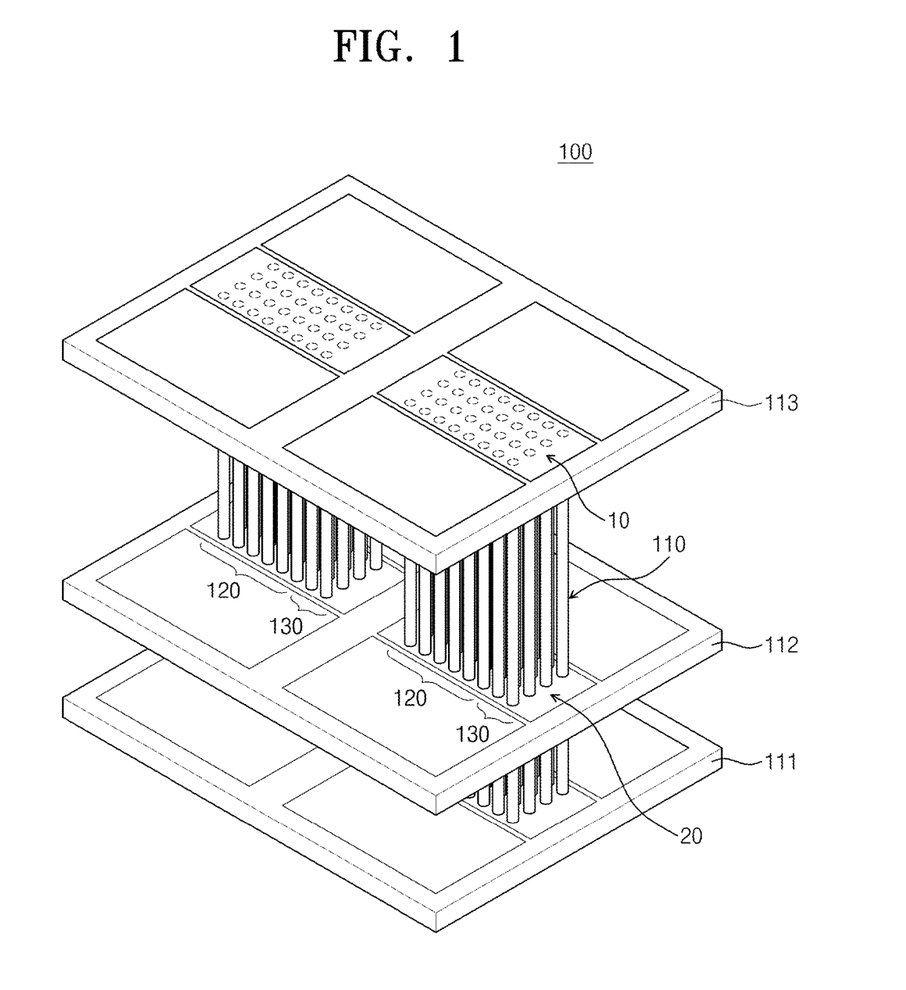
FIG. 1 is a perspective view schematically illustrating a semiconductor device according to an embodiment of the inventive concept.

FIG. 1 is a perspective view schematically illustrating a semiconductor device according to an embodiment of the inventive concept. Referring to FIG. 1, a semiconductor device 100 according to an embodiment of the inventive concept may include a plurality of semiconductor dies 111, 112 and 113 stacked and a plurality of signal transmission units 110 transmitting signals between the semiconductor dies 111, 112 and 113. Each of the semiconductor dies 111, 112 and 113 may be, for examples, a memory chip or a processor chip. However, the scope and spirit of the inventive concept may not be limited thereto. Each signal transmission unit 110 may include a plurality of through-electrodes (e.g., through-silicon via (TSV)) 120 formed between the semiconductor dies 111, 112 and 113, and channel determination units 10 and 20 determining transmission channels of signals to connect the signals to the different through-electrodes 120.

The through-electrodes 120 may be implemented, for examples, with through-silicone vias (TSV) which are formed to vertically pass through an insulated silicon layer (not illustrated) between the semiconductor dies 111, 112 and 113. However, the scope and spirit of the inventive concept may not be limited thereto. The plurality of through-electrodes 120 comprise a plurality of redundancy through-electrodes (e.g., redundancy through-silicon via (RTSV)) 130. The through-electrodes 120 may be arranged to make a plurality of rows and a plurality of columns. For example, the channel determination units 10 and 20 may be implemented in or on the semiconductor dies 111, 112 and 113.

Figure 2:
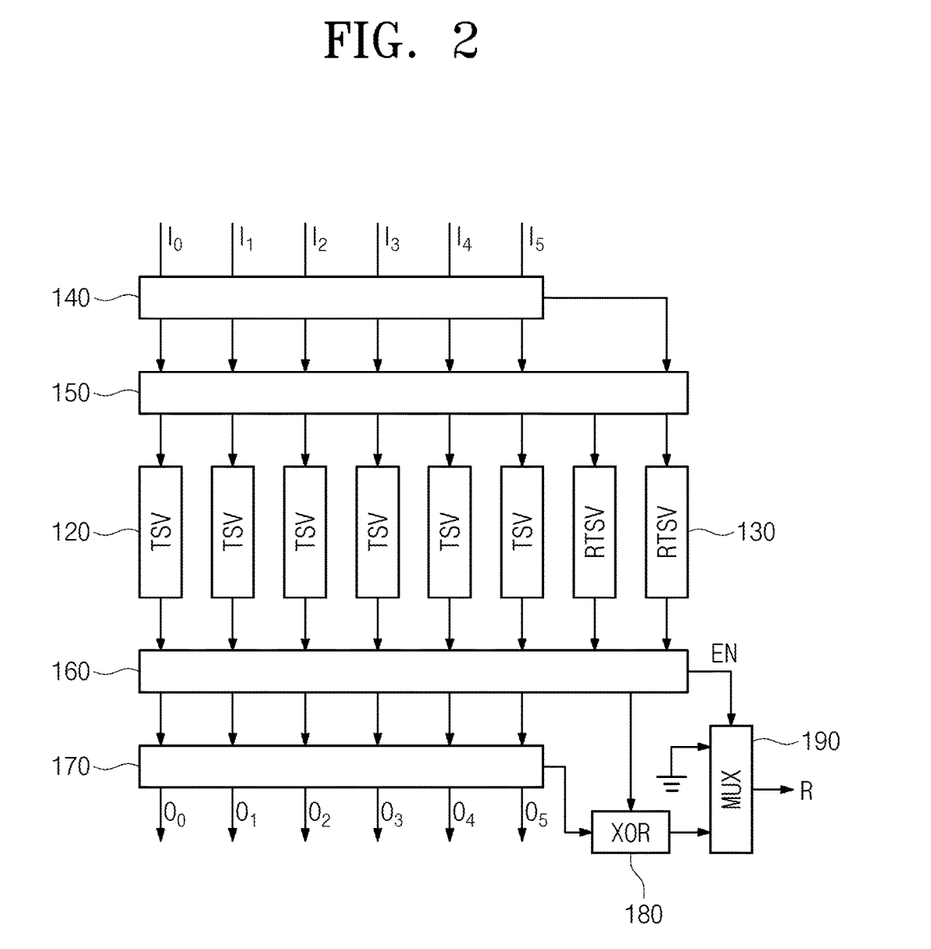
FIG. 2 is a diagram schematically illustrating a semiconductor device according to an embodiment of the inventive concept.

FIG. 2 is a diagram schematically illustrating a semiconductor device according to an embodiment of the inventive concept. Referring to FIGS. 1 to 2, the semiconductor device according to an embodiment of the inventive concept may include a plurality of through-electrodes 120 formed between the semiconductor dies, a first calculation unit 140, a first signal channel determination unit 150, a second signal channel determination unit 160, a second calculation unit 170, a comparator 180, and a multiplexer 190. In an example of FIG. 2, one signal transmission unit 110 may include eight through-electrodes 120 including two redundancy through-electrodes 130, but the numbers of the through-electrodes 120 and the redundancy through-electrodes 130 may be not limited thereto.

The first calculation unit 140 may calculate a first output value by logically combing input signals I0 to I5 inputted to the through-electrodes 120. The first calculation unit 140 may include at least one logic gate performing a logical operation on the input signals I0 to I5 to output the first output value. The first output value calculated by the first calculation unit 140 may be inputted to the first signal channel determination unit 150.

The first signal channel determination unit 150 may select a first redundancy through-electrode 130, transmitting the first output value, from among a plurality of redundancy through-electrodes and may output the first output value to the selected redundancy through-electrode 130. According to an embodiment of the inventive concept, the first signal channel determination unit 150 may select the first redundancy through-electrode among redundancy through-electrodes not used for repairing the defective through-electrodes. The first signal channel determination 150 may include a first switch/fuse circuit for determining a signal transmission channel of the input signals I0 to I5 for the through-electrodes 120.

The second signal channel determination unit 160 may select the first redundancy through-electrode 130 among a plurality of redundancy through-electrodes 130 and may output the first output value, received through the first redundancy through-electrode 130, to the comparator 180. In an embodiment of the inventive concept, the second signal channel determination unit 160 may determine whether redundancy through-electrodes not used for repairing exist after replacing defective through-electrodes and may output a selection signal EN as the determination result. The second signal channel determination unit 160 may include a second switch/fuse circuit for determining a signal transmission channel of output signals O0 to O5 outputted through the through-electrodes 120.

For a defective through-electrode 120, the first signal channel determination unit 150 and the second signal channel determination 160 may allow the defective through-electrode 120 to be replaced with a redundancy through-electrode, determined according to the same repair algorithm, from among the redundancy through-electrodes 130 and the first output value to be transferred through a first redundancy through-electrode 130, determined according to the same algorithm criteria, from among remaining redundancy through-electrodes 130 other than the replaced redundancy through-electrode 130. The second signal channel determination unit 160 may transmit the output signals O0 to O5 to the second calculation unit 170 and may transmit the first output value to the comparator 180.

The second calculation unit 170 may calculate a second output value by logically combining output signals outputted from a plurality of through-electrodes 120. The second calculation unit 170 may include at least one logic gate performing a logical operation on the output signals O0 to O5 to output the second output value. The second output value calculated by the second calculation unit 170 may be inputted to the comparator 180. In an embodiment of the inventive concept, the first calculation unit 140 and the second calculation unit 170 may respectively calculate the first output value and the second output value through the same logical combination operation. The first calculation unit 140 170 may include logic gates which receive input signals to output the first output value. The second calculation unit 170 may include logic gates which receive output signals corresponding to the input signals to output the second output value. Accordingly, when the output signals are the same as the input signals, the first output value and the second value may have the same value. If at least one of the output signals has a different value from a corresponding input signal, the second output value may be expressed with a different value from the first output value.

The comparator 180 may compare the first output value with the second output value. In an embodiment of the inventive concept, the comparator 180 may include an XOR gate which receives the first output value from the second signal channel determination unit 160 and receives the second output value from the second calculation unit 170 to compare the first output value with the second output value. For example, the comparator 180 may output a logical low signal (logic '0') when the first output value and the second output value are the same, and may output a logical high signal (logic '1') when the first output value and the second output value are different from each other. The multiplexer 190 may select an output of the comparator 180 or ground signal, that is, a logical low signal based on a selection signal EN of the second signal channel determination unit 160. In the case of testing signal transmission between the semiconductor dies, when defective through-electrodes of which the number is less than the number of the redundancy through-electrodes 130 occur in one signal transmission unit 110, the first signal channel determination unit 150 may perform a repair operation of the defective through-electrodes 130 through a control of the switch/fuse circuit. In this case, the first calculation unit 140 of a signal transmission (input) side may convert the input signals I0 to I5 into a first output value of one bit through logic gates. The first signal channel determination unit 150 may connect the first output value to a first redundancy through-electrode 130, not used for repairing, so as to be transmitted to a semiconductor die of a signal receiving side. In the signal receiving (output) side, the second calculation unit 170 may convert the output signals O0 to O5 into a second output value of one bit through the logic gates. The bit of the second output value may be compared with the bit of the first output value transmitted through the first redundancy through-electrode 130 to determine whether the signal transmission unit is normal.

If all spare redundancy through-electrodes (e.g., RTSV) 130 are used for replacement of through-electrodes in a repair process, the second signal channel determination unit 160 may output a logical low signal (logic '0') as the selection signal EN. Accordingly, the multiplexer 190 may select a ground signal and thus may output logic '0'(a ground signal) as a value of an output signal R. If the spare redundancy through-electrodes 130 remain after the through-electrodes are repaired, the second signal channel determination unit 160 may output a logical high signal (logic '1') as the selection signal EN. Accordingly, the multiplexer 190 may select an output of the comparator 180 such that an output signal R has a value of logic '1' when the signal transmission unit 110 has a trouble to transmit signals between dies and such that the output signal R has a value of logic '0' when the signal transmission unit 110 doesn't have a trouble to transmit signals between dies.

Figure 3:
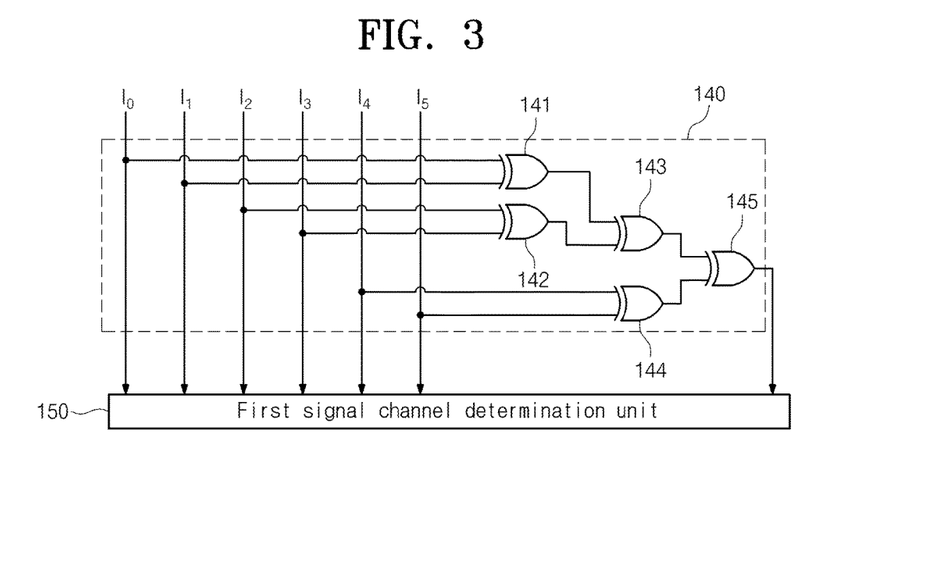
FIG. 3 is a diagram more schematically illustrating a first calculation unit of a semiconductor device according to an embodiment of the inventive concept.

FIG. 3 is a diagram more schematically illustrating a first calculation unit of a semiconductor device according to an embodiment of the inventive concept. Referring to FIG. 3, the first calculation unit 140 may include XOR gates coupled in a multiple tree structure. In an example of FIG. 3, the first calculation unit 140 may include 5 XOR gates 141 to 145 coupled in a 3-stage tree structure, but the number or structure of the XOR gates may vary according to the number of input signals. The first calculation unit 140 may output logic high (logic '1') as a first output value when the number of input signals, having logic high (logic '1'), from among 6 input signals I0 to I5 is odd-numbered (e.g., 1, 3 or 5) and may output logic low (logic '0') as the first output value when the number of input signals, having the logic high (logic '1'), from among the 6 input signals I0 to I5 is even-numbered (e.g., 0, 2, 4 or 6).

Figure 4:
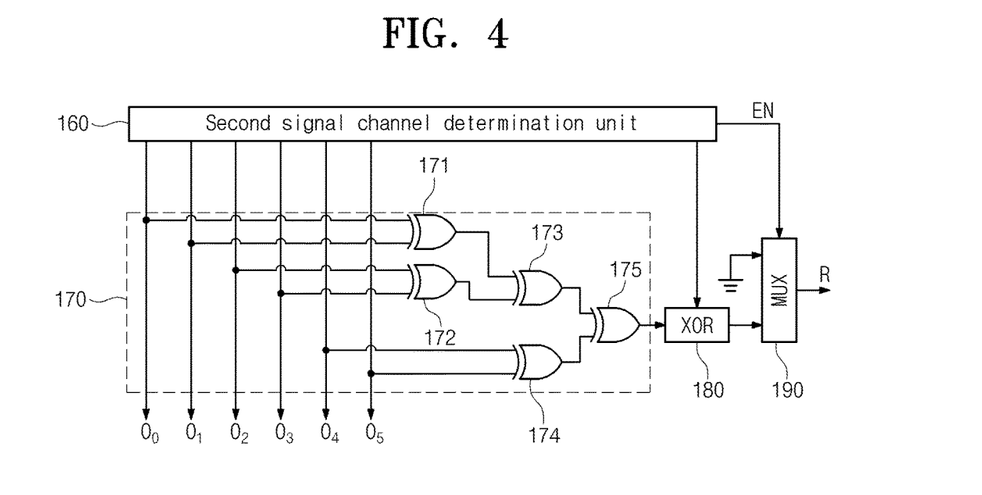
FIG. 4 is a diagram more schematically illustrating a second calculation unit of a semiconductor device according to an embodiment of the inventive concept.

FIG. 4 is a diagram more schematically illustrating a second calculation unit of a semiconductor device according to an embodiment of the inventive concept. Referring to FIG. 4, like the first calculation unit 140 illustrated in FIG. 3, the second calculation unit 170 may include 5 XOR gates 171 to 175 coupled in a 3-stage tree structure. The second calculation unit 170 may output a logic high signal (logic '1') as a second output value when the number of input signals, having logic high (logic '1'), from among 6 input signals I0 to I5 is odd-numbered (e.g., 1, 3 or 5) and may output logic low (logic '0') as the second output value when the number of input signals, having the logic high (logic '1'), from among the 6 input signals I0 to I5 is even-numbered (e.g., 0, 2, 4 or 6).

Figure 5:
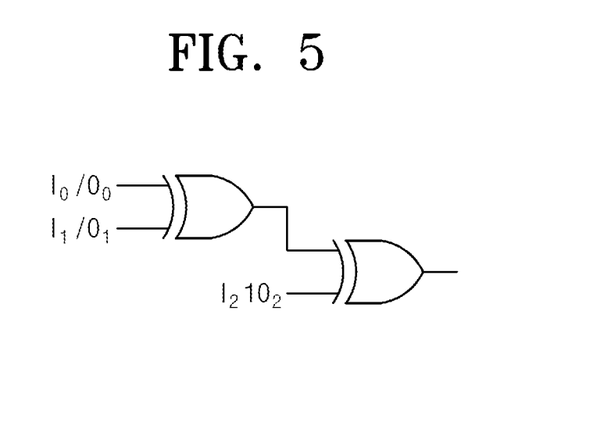
FIG. 5 to FIG. 8 is diagrams illustrating various examples of a first calculation unit and a second calculation unit according to an embodiment of the inventive concept.
Figure 6:
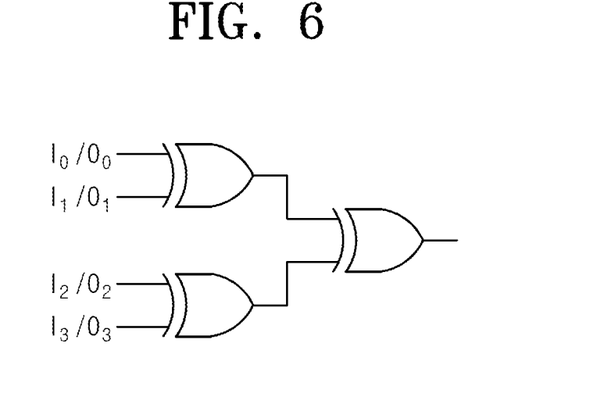
Figure 7:
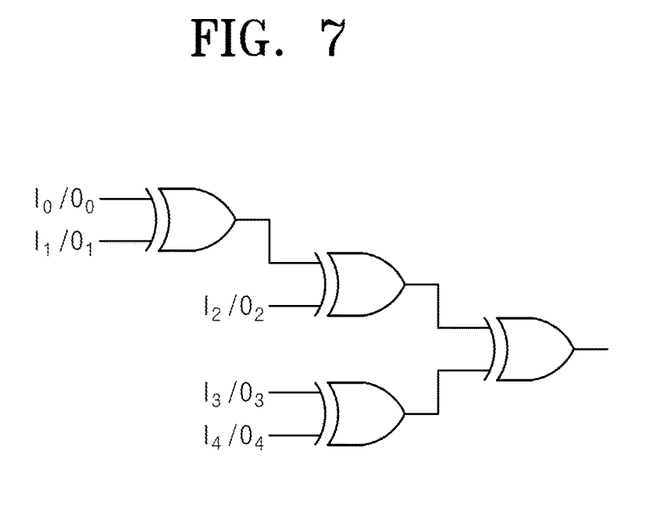
Figure 8:
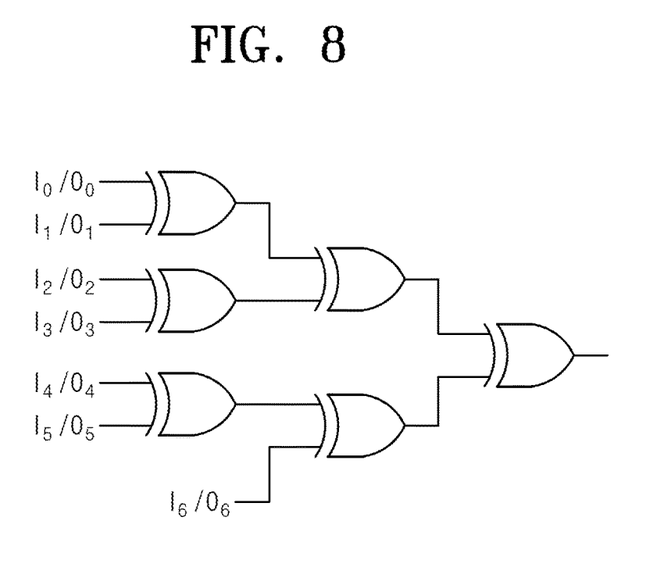

FIG. 5 to FIG. 8 is diagrams illustrating various examples of a first calculation unit and a second calculation unit according to an embodiment of the inventive concept. A first calculation unit 140 and a second calculation unit 170 may be implemented with 2 XOR gates coupled in a 2-stage tree structure, as illustrated in FIG. 5, when the number of input signals is 3. The first calculation unit 140 and the second calculation unit 170 may be implemented with 3 XOR gates coupled in a 2-stage tree structure, as illustrated in FIG. 6, when the number of the input signals is 4. The first calculation unit 140 and the second calculation unit 170 may be implemented with 4 XOR gates coupled in a 3-stage tree structure, as illustrated in FIG. 7, when the number of the input signals is 5. The first calculation unit 140 and the second calculation unit 170 may be implemented with 6 XOR gates coupled in a 3-stage tree structure, as illustrated in FIG. 8, when the number of the input signals is 7.

Figure 9:
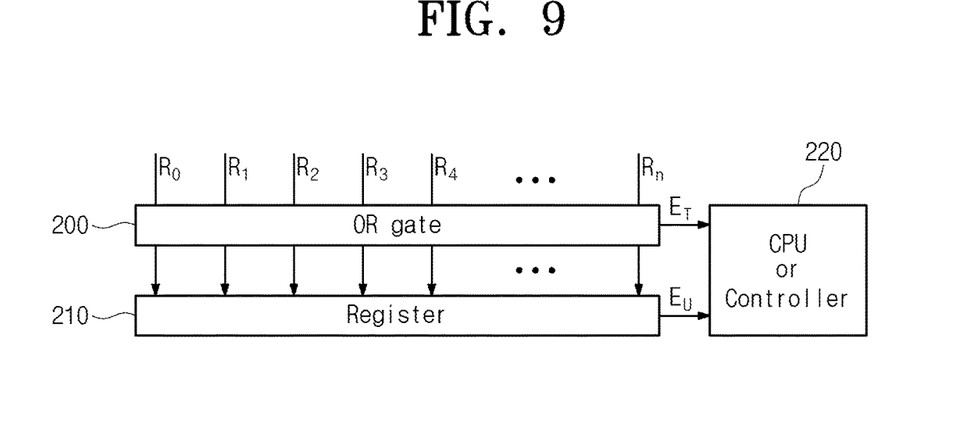
FIG. 9 is a block diagram illustrating an OR gate and a register included in a semiconductor device.
Figure 10:
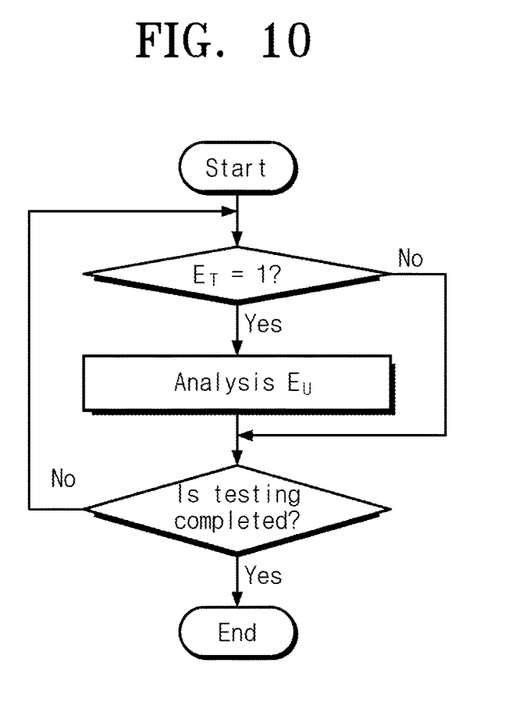
FIG. 10 is a flow chart illustrating a test method of a semiconductor device according to an embodiment of the inventive concept.

According to an embodiment of the inventive concept, an error may be simply detected through comparison in which an XOR gate tree is used. Data to be continuously monitored for the testing of the signal transmission unit 110 may be only 1 bit. According to an embodiment of the inventive concept, an error detection function may be supported during a signal transmission operation, thereby improving the reliability of the semiconductor device. In a structure in which through-electrodes and redundancy through-electrodes are arranged in a grid form, when the through-electrodes arranged in a matrix of rows and columns are implemented with one signal transmission unit 110, an efficient configuration may be possible by using a compactor. FIG. 9 is a block diagram illustrating an OR gate and a register included in a semiconductor device, according to an embodiment of the inventive concept. The semiconductor device according to an embodiment of the inventive concept may further include an OR gate providing a controller 220 with a result of logically combining comparison values R0 to Rn received from a plurality of signal transmission units 110 and a register 210 storing the comparison values R0 to Rn. If at least one of the comparison values R0 to Rn received from the signal transmission units 110 has logic high (logic '1'), the OR gate may transmit a logic high signal (logic '1') as a test result signal ET to the controller 220. The comparison values R0 to Rn, that is, output signals R of the signal transmission units 110 may be converted into a 1-bit test result signal ET through the OR gate 210. The register 210 may transmit information EU of the comparison values R0 to Rn, inputted from the signal transmission units 110, to the control unit 220. FIG. 10 is a flow chart illustrating a test method of a semiconductor device according to an embodiment of the inventive concept. Referring to FIG. 10, when testing is initiated and a test pattern is inserted, a controller 220 may determine whether a test signal ET has logic '1'. That is, the control unit 220 may monitor a value of a 1-bit test result signal ET obtained by logically combining values of output signal R of each signal transmission unit 110. When there occurs the event that any one of the signal transmission units 110 is problematic, the control unit 220 may easily recognize the event from an output of the OR gate 200. If the test signal ET has logic '1', the control unit 220 may analyze an accurate position of a through-electrode, which is detected as being defective, by using information EU of comparison values inputted from the register 210. This process may be repeatedly performed until testing is completed with respect to all test patterns.

Figure 11:
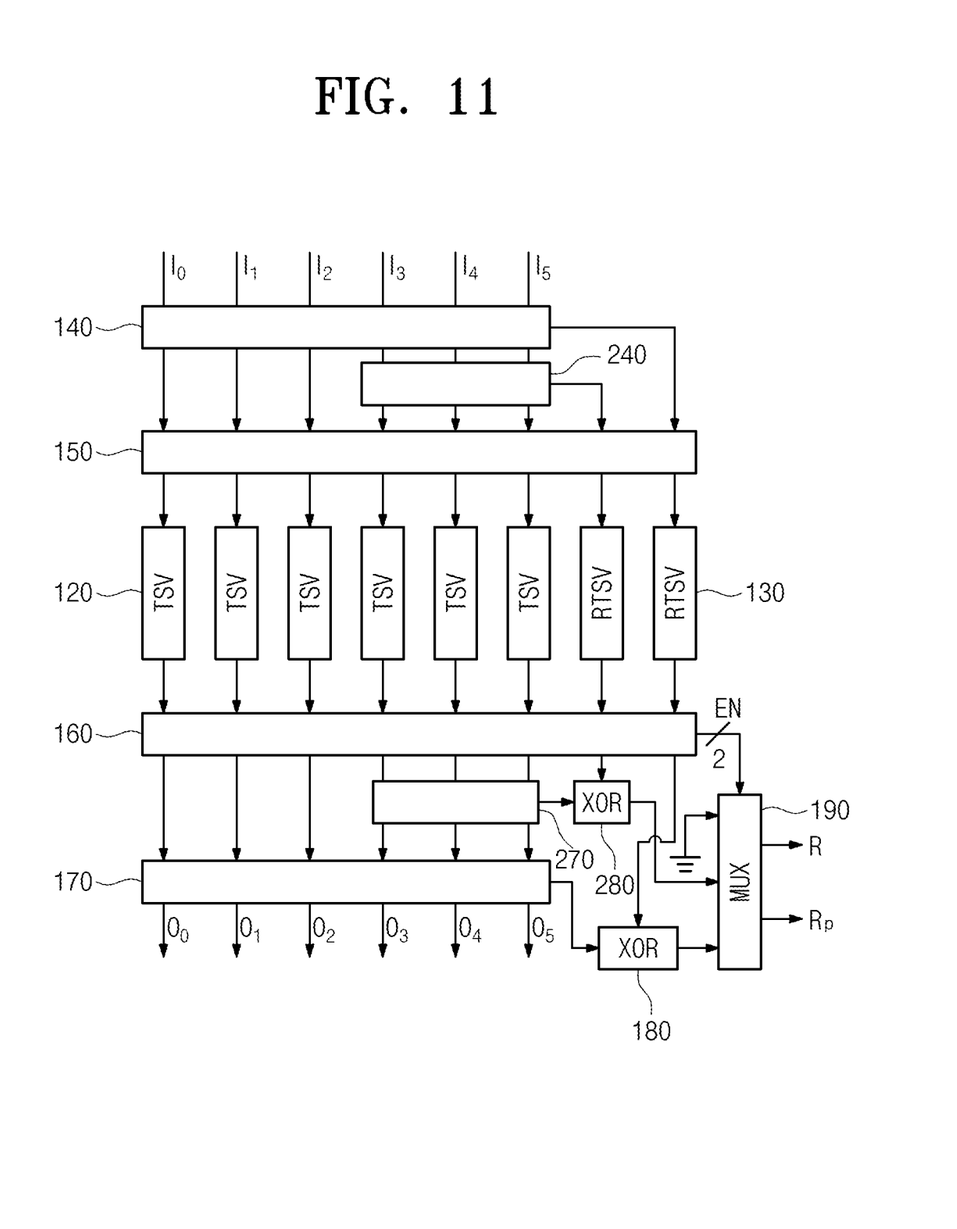
FIG. 11 is a diagram schematically illustrating a semiconductor device according to another embodiment of the inventive concept.

According to an embodiment of the inventive concept, whether the through-electrodes 120 are defective may be determined according to an output of the comparator 180. According to an embodiment of the inventive concept, a method for testing a semiconductor device may perform on-line testing for determining whether through-electrodes are erroneous while transmitting signals between a plurality of dies 111, 112 and 113 through the through-electrodes 120. For soft error detection, a result of an OR operation may be continuously monitored like the on-line testing. If a problem occurs, a task corresponding to the problem may be stopped and may be restarted. FIG. 11 is a diagram schematically illustrating a semiconductor device according to another embodiment of the inventive concept. Referring to FIG. 11, a semiconductor device according to an embodiment of the inventive concept may include a plurality of first calculation units 140 and 240, a plurality of second calculation units 170 and 270, and a plurality of comparators 180 and 280. Each of the second calculation units 170 and 270 may calculate a second output value from at least a portion of signals from among output signals outputted from a plurality of through-electrodes 120 by the same logic operation as each of the first calculation units 140 and 240 corresponding to Each of the second calculation units 170 and 270, respectively. The comparators 180 and 280 may respectively compare each of the first output values of the first calculation units 140 and 240 with each of the second output values of the second calculation units 170 and 270 corresponding to the first calculation units 140 and 240, thereby outputting comparison values. According to an embodiment of the inventive concept, the first output values of the first calculation units 140 and 240 may be transferred through different redundancy through-electrodes 130 from each other.

In an embodiment of the inventive concept, a first signal channel determination unit 150 may select first redundancy through-electrodes to transmit first output values of the first calculation units 140 and 240, from among a plurality of redundancy through-electrodes 130 and may output the first output values to the first redundancy through-electrodes thus selected. In an embodiment of the inventive concept, the second signal channel determination unit 160 may select the first redundancy through-electrodes among the redundancy through-electrodes 130 and may output the first output value, received from the first redundancy through-electrodes, to the comparators 180 and 280. In an embodiment of the inventive concept, the second signal channel determination unit 160 may output a selection signal according to the number of redundancy through-electrodes remaining after replacing a defective through-electrode(s), and the multiplexer 190 may select an output of each of the comparators 180 and 280 or a logically low signal based on the selection signal.

In an embodiment of the inventive concept, each of the first calculation units 140 and 240 may calculate first output values from different combinations of input signals. Here, input signals used for the first calculation unit 140 to calculate the first output signals may be different from those used for the first calculation unit 240 to calculate the first output values. Each of the second calculation units 170 and 270 may calculate second output values from different combinations of output signals. Here, output signals used for the second calculation unit 170 to calculate the second output values may be different from those used for the second calculation unit 270 to calculate the second output values. In an embodiment of FIG. 11, the first calculation unit 240 which receives 3 input signals I3 to I5 of 6 input signals I0 to I5 may calculate a first output value from the 3 input signals I3 to I5. The second calculation unit 270 corresponding thereto may receive 3 output signals O3 to O5, corresponding to the 3 input signals I3 to I5, of 6 output signals O0 to O5 to calculate a second output value.

The comparator 280 may compare the first output value, calculated from the 3 input signals I3 to I5, with the second output value calculated from the 3 output signals O3 to O5. A multiplexer 190 may select any one of an output of the first comparator 180 and a ground signal based on a selection signal EN of 2 bits and may output the selected result as an output signal R. The multiplexer 190 may select any one of an output of the second comparator 280 and a ground signal based on the selection signal EN of 2 bits and may output the selected result as an output signal Rp. According to an embodiment of FIG. 11, since two output signals R and Rp are analyzed to test the signal transmission unit 110, reliability of the testing may be improved.

Figure 12:
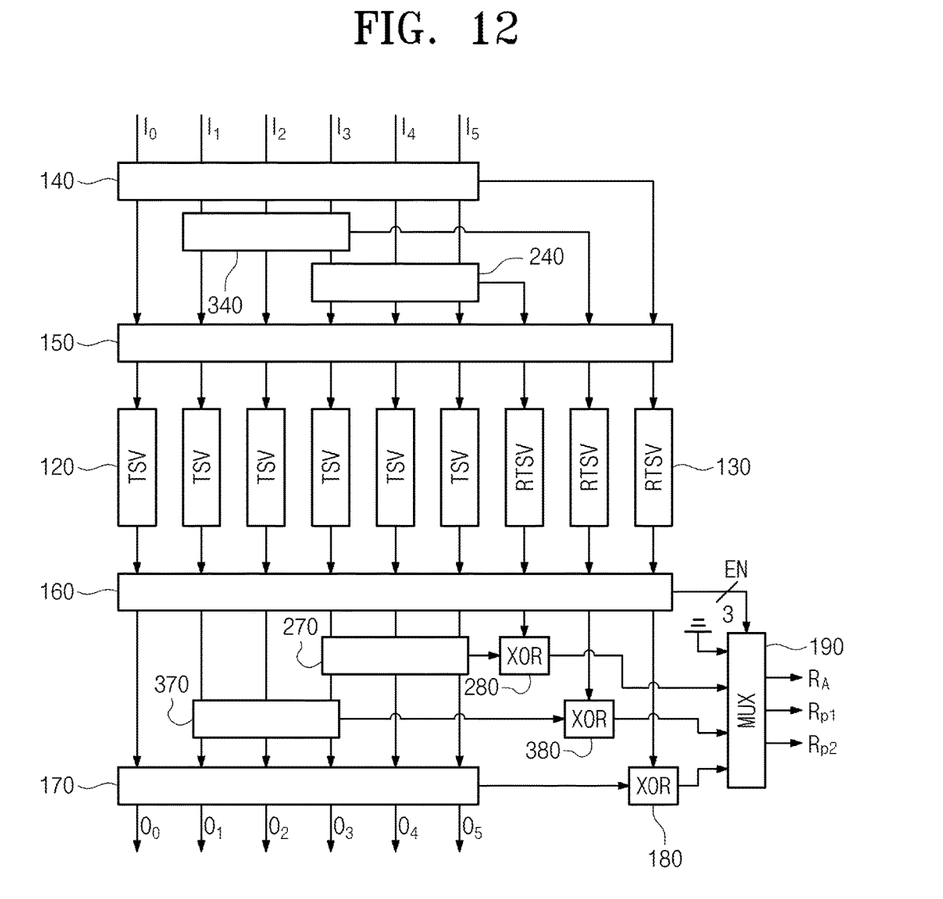
FIG. 12 is a diagram schematically illustrating a semiconductor device according to still another embodiment of the inventive concept.

FIG. 12 is a diagram schematically illustrating a semiconductor device according to still another embodiment of the inventive concept. Referring to FIG. 12, a semiconductor device according to an embodiment of the inventive concept may include three first calculation units 140, 240 and 340, three second calculation units 170, 270 and 370, three comparators 180, 280 and 380. Compared to an embodiment of FIG. 11, the embodiment of FIG. 12 may further include a first calculation unit 340 calculating a first output value from 3 input signals I1 to I3 of 6 input signals I0 to I5, a second calculation unit 370 calculating a second output value from 3 output signals O1 to O3, corresponding to the 3 input signals I1 to I3, of 6 output signals O0 to O5, a comparator 380 comparing the first output value calculated from the 3 input signals I1 to I3 with the second output value calculated from the 3 output signals O1 to O3.

A multiplexer 190 may select any one of an output of the first comparator 180 and a ground signal based on a selection signal EN of 3 bits and may output the selected result as an output signal RA. The multiplexer 190 may select any one of an output of the second comparator 280 and the ground signal based on the selection signal EN of 3 bits and may output the selected result as an output signal Rp1. The multiplexer 190 may select any one of an output of a third comparator 380 and the ground signal based on the selection signal EN of 3 bits and may output the selected result as an output signal Rp2. According to an embodiment of FIG. 12, since three output signals RA, RP1 and RP2 are analyzed to test the signal transmission unit 110, reliability of the testing may be improved.

According to embodiments of the inventive concept, a first output value calculated from the first calculation unit 140 may be transmitted into a semiconductor die of a signal receiving side through a spare redundancy through-electrode 130 not used for repairing defective through-electrodes.

That is, the redundancy through-electrodes 130 may be used to test the signal transmission unit 110 including a plurality of trough-electrodes, thereby making it possible to greatly improve utilization of the spare redundancy through-electrodes 130 existed in a three-dimensional semiconductor. Input signals and output signals of the signal transmission unit 110 may be converted into data of the less number of bits by the first calculation unit 140 and the second calculation unit 170. The comparator 180 may compare pieces of data of the less number of bits converted by the first calculation unit 140 and the second calculation unit 170. The controller 220 may efficiently determine whether the signal transmission unit 110 is normal, through a comparison result of the comparator 180. According to an embodiment of the inventive concept, on-line testing may be performed and a soft error which occurs intermittently may be detected. While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

The invention claimed is:

1. A semiconductor device comprising:
a plurality of semiconductor dies staked;
a plurality of through-electrodes between the semiconductor dies;
a first calculation unit configured to perform a first logical combination operation on input signals provided to the through-electrodes to calculate a first output value;
a second calculation unit configured to perform a second logical combination operation on output signals transmitted from the through-electrodes to calculate a second output value; and
a comparator configured to compare the first output value with the second output value,
wherein the plurality of through-electrodes comprise at least one redundancy through-electrode,
a first redundancy through-electrode among the at least one redundancy through-electrode is configured to transmit the first output value therethrough, and
the semiconductor device further comprises a first signal channel determination unit configured to select the first redundancy through-electrode from among the at least one redundancy through-electrode, receive the first output value from the first calculation unit, and transfer the first output value to the first redundancy through-electrode.

2. The semiconductor device of claim 1, wherein the first logical combination operation and the second logical combination operation are a same logical combination operation.

3. The semiconductor device of claim 1, wherein each of the first calculation unit and the second calculation unit comprises XOR gates coupled in a multiple-stage tree structure.

4. The semiconductor device of claim 1, wherein the first signal channel determination unit is further configured to select the first redundancy through-electrode from among one or more of the at least one redundancy through-electrode that are not used for repairing defective through-electrodes.

5. The semiconductor device of claim 4, further comprising:
a second signal channel determination unit configured to receive the first output value from the first redundancy through-electrode, and transfer the first output value received from the first redundancy through-electrode to the comparator.

6. The semiconductor device of claim 5, wherein the second signal channel determination unit is further configured to determine whether the at least one redundancy through-electrode includes a redundancy through-electrode not used for repairing a defective through-electrode, and output a selection signal as a determination result, and
the semiconductor device further comprises a multiplexer configured to select an output of the comparator or a logical low signal based on the selection signal.

7. The semiconductor device of claim 5, wherein the comparator comprises:
an XOR gate configured to compare the first output value received from the first signal channel determination unit with the second output value received from the second calculation unit.

8. A method of testing a semiconductor device set forth in claim 1, the method comprising:
calculating the first output value by performing the first logical combination operation on the input signals provided to the through-electrodes, using the first calculation unit;
calculating the second output value by performing the second logical combination operation on output signals transmitted from the through-electrodes using the second calculation unit;
comparing the first output value with the second output value by the comparator; and
determining whether the through-electrodes are normal based on an output of the comparator.

9. The method of claim 8, wherein the method determines whether the through-electrodes are normal, while transmitting signals between the semiconductor dies through the through-electrodes.

10. A three-dimensional semiconductor device comprising:
a plurality of semiconductor dies stacked;
a plurality of signal transmission units between the semiconductor dies, each of the signal transmission units including,
a plurality of through-electrodes between the semiconductor dies, the plurality of through-electrodes including at least one redundancy through-electrode,
a first calculation unit configured to perform a first logical combination operation on input signals provided to the through-electrodes to calculate a first output value,
a second calculation unit configured to perform a second logical combination operation on output signals transmitted from the through-electrodes to calculate a second output value, the first logical combination operation and the second logical combination operation being a same logical operation, and
a comparator configured to compare the first output value with the second output value to output a comparison value;
a first signal channel determination unit configured to select a first redundancy through-electrode from among the at least one redundancy through-electrode, receive the first output value from the first calculation unit, and transfer the first output value to the first redundancy through-electrode; and
a second signal channel determination unit configured to receive the first output value from the first redundancy through-electrode, and transfer the first output value received from the first redundancy through-electrode to the comparator.

11. The three-dimensional semiconductor device of claim 10, further comprising:
- an OR gate configured to receive comparison values from the signal transmission units and output a result of an OR operation to a controller; and
- a register configured to store the comparison values.

12. A semiconductor device comprising:
- a plurality of semiconductor dies stacked;
- a plurality of through-electrodes between the semiconductor dies;
- a plurality of first calculation units, each of the first calculation units configured to perform a first logical combination operation on at least a portion of input signals provided to the through-electrodes to calculate a first output value;
- a plurality of second calculation units, each of the second calculation units configured to perform a second logical combination operation on at least a portion of output signals transmitted from the through-electrodes to calculate a second output value, the first logical combination operation and the second logical combination operation being a same logical operation; and
- a plurality of comparators configured to output comparison values by comparing the first output value of each of the first calculation units with the second output value of a corresponding one of the second calculation units corresponding to each of the first calculation units, wherein the plurality of through-electrodes comprise a plurality of redundancy through-electrodes, the first calculation units are further configured to transmit the first output values through different ones of the redundancy through-electrodes, wherein the semiconductor device further comprises,
- a first signal channel determination unit configured to select first redundancy through-electrodes, which are configured to transmit the first output values of the first calculation units, from among the redundancy through-electrodes, receive the first output values from the first calculation units, and transfer the first output values to selected ones of the first redundancy through-electrodes, and
- a second signal channel determination unit configured to receive the first output values from each of the first redundancy through-electrodes, and transfer the first output values received from the first redundancy through-electrodes to the comparators.

13. The semiconductor device of claim 12, wherein the first calculation units are further configured to calculate the first output values from different signals of the portion of the input signals, respectively, and
the second calculation units are further configured to calculate the second output values from different signals of the portion of the output signals, respectively.

14. The semiconductor device of claim 12, wherein the second signal channel determination unit is further configured to output a selection signal according to a number of redundancy through-electrodes not used for repairing a defective through-electrode from among the redundancy through-electrodes, and
the second signal channel determination unit further includes a multiplexer configured to select one of an output of each of the comparators or a logically low signal based on the selection signal.

15. The semiconductor device of claim 12, further comprising:
- an OR gate configured to receive the comparison values from the comparators and output a result of an OR operation on the comparison values to a controller; and
- a register configured to store the comparison values.

* * * * *